(12) United States Patent
Kai et al.

(10) Patent No.: US 7,323,284 B2
(45) Date of Patent: Jan. 29, 2008

(54) NEGATIVE TYPE RADIATION SENSITIVE RESIN COMPOSITION

(75) Inventors: Toshiyuki Kai, Yokkaichi (JP); Daigo Ichinohe, Yokkaichi (JP)

(73) Assignee: JSR Corporation, Tokyo (JP)

( * ) Notice: Subject to any disclaimer, the term of this patent is extended or adjusted under 35 U.S.C. 154(b) by 112 days.

(21) Appl. No.: 10/171,583

(22) Filed: Jun. 17, 2002

(65) Prior Publication Data

US 2003/0022095 A1    Jan. 30, 2003

(30) Foreign Application Priority Data

Jun. 18, 2001 (JP) .............................. 2001-182897
Aug. 30, 2001 (JP) .............................. 2001-262027

(51) Int. Cl.
*G03F 7/004* (2006.01)
(52) U.S. Cl. .................... 430/170; 430/270.1; 430/905
(58) Field of Classification Search ................ 403/170; 430/270.1, 905, 170
See application file for complete search history.

(56) References Cited

U.S. PATENT DOCUMENTS

| 4,581,321 | A |   | 4/1986  | Stahlhofen |           |
|-----------|---|---|---------|------------|-----------|
| 4,889,789 | A |   | 12/1989 | Stahlhofen |           |
| 5,663,035 | A | * | 9/1997  | Masuda et al. | 430/270.1 |
| 5,700,625 | A |   | 12/1997 | Sato et al. |           |
| 6,455,223 | B1| * | 9/2002  | Hatakeyama et al. | 430/270.1 |
| 6,511,783 | B1| * | 1/2003  | Uenishi    | 430/270.1 |
| 6,528,233 | B2| * | 3/2003  | Adegawa    | 430/270.1 |
| 6,673,512 | B1| * | 1/2004  | Uenishi et al. | 430/270.1 |
| 2002/0187422 | A1 | * | 12/2002 | Angelopoulos et al. | 430/270.1 |

FOREIGN PATENT DOCUMENTS

| DE | 37 11 264 A1 | 10/1988 |
|----|--------------|---------|
| EP | 0 133 216    | 7/1984  |
| EP | 0 212 482 A2 | 8/1986  |
| EP | 0 613 050 A2 | 8/1994  |
| EP | 1117002 A1 * | 7/2001  |
| JP | 01-293339    | 11/1989 |
| JP | 02-015270    | 1/1990  |
| JP | 05-034922    | 2/1993  |
| JP | 6-301200     | 10/1994 |
| JP | 07-120924    | 5/1995  |
| JP | 07-311463    | 11/1995 |
| JP | 08-044061    | 2/1996  |
| JP | 8-292559     | 11/1996 |
| JP | 09166870 A * | 6/1997  |
| JP | 10-186661    | 7/1998  |
| JP | 10-069082    | 10/1998 |

* cited by examiner

*Primary Examiner*—John S. Chu
(74) *Attorney, Agent, or Firm*—Merchant & Gould, P.C.; Christopher W. Raimund

(57) ABSTRACT

A negative type radiation sensitive resin composition comprising:
(A) an alkali-soluble resin containing the polymerized unit of a polymerizable unsaturated compound having a phenolic hydroxyl group and having a weight average molecular weight of 4,100 to 20,000 and a weight average molecular weight/number average molecular weight ratio of more than 1.25 to not more than 2.00;
(B) a radiation sensitive acid generating agent; and
(C) an acid crosslinking agent.

This composition can be used with an alkali developer having a normal concentration, can form a high-resolution rectangular line-and-space resist pattern, and provides a chemically amplified negative type resist which is free from a resist pattern defect (bridging or chip line) after development and has excellent sensitivity, developability and dimensional fidelity.

15 Claims, No Drawings

NEGATIVE TYPE RADIATION SENSITIVE RESIN COMPOSITION

FIELD OF THE INVENTION

The present invention relates to a radiation sensitive resin composition. More specifically, it relates to a negative type radiation sensitive resin composition which is useful as a chemically amplified negative type resist suitable for lithography making use of radiation such as far ultraviolet radiation, X-radiation or charged corpuscular beams.

DESCRIPTION OF THE PRIOR ART

In the field of lithography typically used for the production of integrated circuit elements, with rapid progress in the reduction of the design rule of lithography to obtain higher integration, a technology capable of stably forming a fine pattern having a line width of 0.25 µm or less is now required. Therefore, as it is desired that the used resist should enable a fine pattern having a line width of 0.25 µm or less to be formed highly accurately, lithography making use of radiation having a shorter wavelength is now being studied from this point of view.

As the radiation having a short wavelength are used far ultraviolet radiation typically from a KrF excimer laser (wavelength of 248 nm) and ArF excimer laser (wavelength of 193 nm), X-radiation typified by synchrotron radiation and charged corpuscular beams typified by electron beams. Various resists able to be used with the above radiation are now under investigation. Out of these resists, special attention is paid to a chemically amplified resist which generates an acid upon exposure to radiation (to be referred to as "exposure" hereinafter) to cause a reaction for changing solubility in a developer by the catalytic function of this acid.

To actually produce an integrated circuit using a resist, a resist solution is prepared by dissolving resist constituents such as a radiation sensitive component and a film forming resin component in a solvent and applied to a substrate to be processed in order to form a resist film which is then exposed through a predetermined mask and developed to form a pattern suitable for lithography. As the sectional form of the pattern has a great influence upon the accuracy of lithography, it is preferably rectangular. In a conventional chemically amplified negative type resist, the dissolution speed in a developer is reduced to form a pattern by promoting a crosslinking reaction in an exposed portion. The contrast of dissolution speed of the resist in a developer between an exposed portion and an unexposed portion is not sufficiently high, thereby reducing resolution and making the top portion of the pattern not rectangular but round. Further, the reduction of the dissolution speed in a developer of the exposed portion is not satisfactory, whereby the pattern may be swollen or formed serpentinely by the developer.

JP-A 1-293339 and JP-A 2-15270 (the term "JP-A" as used herein means an "unexamined published Japanese patent application") disclose chemically amplified negative type resist compositions which comprise an amino resin such as a glycoluril resin as a crosslinking agent. However, it has been difficult to form a satisfactory fine pattern having a line width of 0.25 µm or less only by selecting a crosslinking agent.

Meanwhile, JP-A 6-301200 discloses a chemically amplified negative type resist composition which comprises an N-(alkoxymethyl)glycoluril compound as a crosslinking agent. This resist composition has a problem that it cannot be used with a 2.38 wt % aqueous solution of tetramethylammonium hydroxide which is generally used as a developer for the production of an integrated circuit element.

JP-A 5-34922 proposes a chemically amplified negative type resist composition which comprises a partly hydrogenated phenol resin and a glycoluril resin crosslinking agent having a specified mononuclear material ratio. However, even when this resist composition is used to form a fine pattern having a line width of 0.25 µm or less, it is impossible to achieve satisfactory performance.

Further, JP-A 7-120924, JP-A 7-311463, JP-A 8-44061, JP-A 8-292559 and JP-A 10-186661 disclose compositions comprising an alkali-soluble resin having specific dispersibility as a chemically amplified negative type resist composition having improved resolution. Although these resist compositions have excellent resolution, they have a problem that resist patterns formed therefrom have a defect (bridging or chip line) after development.

SUMMARY OF THE INVENTION

It is an object of the present invention to provide a negative type radiation sensitive resin composition which can be used with an alkali developer having an ordinary concentration, can form a high-resolution rectangular resist pattern in an ordinary line-and-space pattern, is free from a resist pattern defect (bridging or chip line) after development and is suitable for use as a chemically amplified negative type resist having excellent sensitivity, developability and dimensional fidelity.

Other objects and advantages of the present invention will become apparent from the following description.

According to the present invention, the above objects and advantages of the present invention are attained by a negative type radiation sensitive resin composition comprising:

(A) an alkali-soluble resin containing the polymerized unit of a polymerizable unsaturated compound having a phenolic hydroxyl group and having a weight average molecular weight of 4,100 to 20,000 and a weight average molecular weight/number average molecular weight ratio of more than 1.25 to not more than 2.00;

(B) a radiation sensitive acid generating agent; and (C) an acid crosslinking agent.

DETAILED DESCRIPTION OF THE PREFERRED EMBODIMENT

The present invention will be described in detail hereinunder.

Component (A)

The component (A) in the present invention is an alkali-soluble resin which contains the polymerized unit of a polymerizable unsaturated compound having a phenolic hydroxyl group (to be referred to as "phenolic unsaturated compound" hereinafter), that is, a unit formed by the cleavage of a polymerizable unsaturated bond. This resin preferably has the polymerized unit of a nonsubstituted or substituted styrene-based compound (to be simply referred to as "another styrene-based compound" hereinafter), that is, a recurring unit formed by the cleavage of a polymerizable unsaturated bond, in addition to the polymerized unit of the above phenolic unsaturated compound.

Examples of the polymerizable unsaturated compound having a phenolic hydroxyl group include o-vinylphenol, m-vinylphenol, p-vinylphenol, o-isopropenylphenol, m-isopropenylphenol and p-isopropenylphenol.

These phenolic unsaturated compounds may be used alone or in combination of two or more.

Examples of the substituent in the another styrene-based compound include linear and branched alkyl groups having 1 to 4 carbon atoms such as methyl group, ethyl group, n-propyl group, i-propyl group, n-butyl group, i-butyl group, sec-butyl group and t-butyl group; linear and branched alkoxy groups having 1 to 4 carbon atoms such as methoxy group, ethoxy group, n-propoxy group, i-propoxy group, n-butoxy group, i-butoxy group, sec-butoxy group and t-butoxy group; and halogen atoms such as fluorine atom, chlorine atom, bromine atom and iodine atom.

Illustrative examples of the styrene-based compound include styrene derivatives substituted by an alkyl group such as styrene, α-methylstyrene, o-methylstyrene, m-methylstyrene, p-methylstyrene and p-t-butylstyrene; styrene derivatives substituted by an alkoxy group such as p-methoxystyrene, p-ethoxystyrene, p-n-propoxystyrene, p-i-propoxystyrene, p-n-butoxystyrene and p-t-butoxystyrene; and styrene derivatives substituted by a halogen atom such as p-fluorostyrene, p-chlorostyrene and p-bromostyrene.

These styrene-based compounds may be used alone or in combination of two or more.

The component (A) in the present invention may contain a recurring unit formed by the cleavage of the polymerizable unsaturated bond of a polymerizable unsaturated compound (to be referred to as "another unsaturated compound" hereinafter) other than the phenolic unsaturated compound and another styrene-based compound.

Examples of the another unsaturated compound include alkyl (meth)acrylates such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate and 2-ethylhexyl (meth)acrylate; hydroxyalkyl (meth)acrylates such as 2-hydroxyethyl (meth)acrylate, 2-hydroxypropyl (meth)acrylate and 3-hydroxypropyl (meth)acrylate; other (meth) acrylic acid esters such as cyclohexyl (meth)acrylate, phenyl (meth)acrylate, benzyl (meth)acrylate and isobornyl (meth) acrylate; unsaturated nitrile compounds such as (meth)acrylonitrile, α-chloroacrylonitrile, α-chloromethylacrylonitrile and vinylidene cyanide; unsaturated amide compounds such as (meth)acrylamide, N,N-dimethyl (meth)acrylamide and N-(2-hydroxyethyl) (meth)acrylamide; unsaturated carboxylic acids (anhydrides) such as (meth)acrylic acid, cinnamic acid, maleic acid, maleic anhydride and fumaric acid; maleimides such as maleimide, N-cyclohexylmaleimide and N-phenylmaleimide; and alicyclic vinyl compounds having a hetero atom such as N-vinylpyrrolidone and N-vinylcaprolactam.

These unsaturated compounds may be used alone or in combination of two or more.

Illustrative examples of the component (A) in the present invention include copolymers of vinylphenol/another styrene-based compound such as a copolymer of p-vinylphenol/styrene, copolymer of p-vinylphenol/α-methylstyrene, copolymer of p-vinylphenol/p-methoxystyrene, copolymer of p-vinylphenol/p-ethoxystyrene, copolymer of p-vinylphenol/p-n-propoxystyrene and copolymer of p-vinylphenol/p-n-butoxystyrene; copolymers of isopropenylphenol/another styrene-based compound such as a copolymer of p-isopropenylphenol/styrene and copolymer of p-isopropenylphenol/α-methylstyrene; copolymers of vinylphenol/styrene/ (meth)acrylic acid ester such as a copolymer of p-vinylphenol/styrene/methyl (meth)acrylate, copolymer of p-vinylphenol/styrene/2-hydroxyethyl (meth)acrylate, copolymer of p-vinylphenol/styrene/2-hydroxypropyl (meth)acrylate, and copolymer of p-vinylphenol/styrene/3-hydroxypropyl (meth)acrylate; and copolymers of phenolic unsaturated compound/styrene/unsaturated nitrile compound such as a copolymer of p-vinylphenol/styrene/(meth) acrylonitrile and copolymer of p-isopropenylphenol/styrene/ (meth)acrylonitrile.

Out of the above components (A), a copolymer of p-vinylphenol/styrene, copolymer of p-vinylphenol/α-methylstyrene, copolymer of p-vinylphenol/p-methoxystyrene, and copolymer of p-vinylphenol/p-ethoxystyrene are particularly preferred.

In the present invention, the content of the recurring unit derived from the phenolic unsaturated compound in the component (A) is preferably 50 to 95 mol %, more preferably 55 to 95 mol %, particularly preferably 60 to 90 mol %. When the content of the recurring unit derived from the phenolic unsaturated compound is lower than 50 mol %, the dissolution speed in an alkali developer lowers, whereby the developability, resolution and the like of the obtained resist may be impaired. When the content is higher than 95 mol %, the resist readily swells with an alkali developer, whereby the pattern shape may be impaired and a pattern defect may be produced.

To produce the component (A) in the present invention, there are available the following methods: (I) one in which a monomer protecting the hydroxyl group of hydroxystyrene, such as p-t-butoxystyrene, p-acetoxystyrene or p-tetrahydropyranyloxystyrene, and optionally another styrene compound and/or another unsaturated compound are subjected to radical, anion or cationic addition polymerization and then, an acid catalyst or basic catalyst is caused to act on the obtained polymer to eliminate the protective group by a hydrolytic reaction; and (II) one in which a phenolic unsaturated compound and optionally another styrene-based compound and/or another unsaturated compound are subjected to radical addition polymerization. Out of these, the method (I) is preferred.

The acid catalyst used in the method (I) is, for example, an inorganic acid such as hydrochloric acid or sulfuric acid. The basic catalyst is, for example, an organic base such as trialkylamine or an inorganic base such as sodium hydroxide.

The component (A) is preferably a mixture of a resin obtained by anion polymerization and a resin obtained by radical polymerization. The mixture preferably consists of 100 parts by weight of the resin obtained by anion polymerization and 30 to 300 parts by weight of the resin obtained by radical polymerization.

The component (A) in the present invention has a weight average molecular weight in terms of polystyrene measured by gel permeation chromatography (GPC) (to be referred to as "Mw" hereinafter) of 4,100 to 20,000, preferably 4,500 to 20,000, more preferably 4,500 to 15,000, particularly preferably 4,500 to 10,000. When Mw is less than 4,100, the film formability of the composition and the sensitivity and the like of the obtained resist may lower and when Mw is more than 20,000, the developability of the resist may lower and a pattern defect may be produced.

The component (A) in the present invention has a dispersibility defined by the ratio (Mw/Mn) of Mw to number average molecular weight in terms of polystyrene measured by gel permeation chromatography (GPC) (to be referred to as "Mn" hereinafter) of more than 1.25 and 2.00 or less, preferably more than 1.25 and 1.70 or less, more preferably more than 1.25 and 1.50 or less. When the dispersibility is 1.25 or less, a resist pattern defect is easily produced and when the dispersibility is more than 2.00, the resolution of the resist may lower.

When the component (A) is a mixture of a resin obtained by anion polymerization and a resin obtained by radical polymerization, the dispersibility of the resin obtained by anion polymerization is preferably 1.0 to 1.3, more preferably 1.0 to 1.2, and the dispersibility of the resin obtained by radical polymerization is preferably 1.3 to 1.8, more preferably 1.4 to 1.7.

The dissolution speed in a 2.38 wt % aqueous solution of tetramethylammonium hydroxide at 23° C. of the component (A) in the present invention is 10 to 130 nm/s, preferably 20 to 100 nm/s when it is a coating film. When the dissolution speed is lower than 10 nm, the solubility in the alkali developer lowers, whereby the developability, resolution and the like of the resist may be impaired. When the dissolution speed is higher than 130 nm/s, resist readily swells with the alkali developer, whereby the pattern shape may be impaired or a pattern defect may be produced.

The above dissolution speed as used herein means a reduction in the weight of a film per sec when the alkali-soluble resin (A) is dissolved in a solvent and the resulting solution is applied to a silicon wafer to a thickness of about 400 nm, heated at 90° C. for 90 seconds and immersed in the 2.38 wt % aqueous solution of tetramethylammoniumm hydroxide at 23° C.

Radiation Sensitive Acid Generating Agent (B)

The component (B) in the present invention is a radiation sensitive acid generating agent (to be referred to as "acid generating agent(B)" hereinafter) which generates an acid upon exposure.

The acid generating agent (B) is, for example, an (1) onium salt compound, (2) sulfonimide compound, (3) diazomethane compound, (4) disulfonylmethane compound, (5) halogen-containing compound, (6) sulfone compound, (7) sulfonic acid ester compound or (8) oxime sulfonate compound.

Illustrative examples of the acid generating agent (B) are given below.

Onium Salt:

The onium salt compound is selected from a sulfonium salt represented by the following formula (1), iodonium salt represented by the following formula (2), phosphonium salt, diazonium salt, ammonium salt and pyridinium salt.

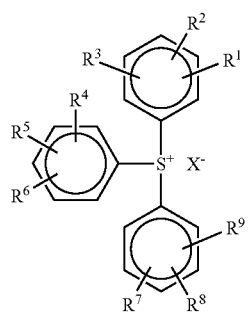

(1)

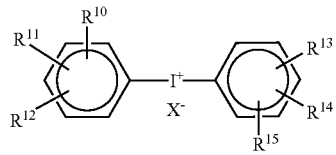

In the above formulas (1) and (2), $R^1$ to $R^{15}$ are the same or different and each a hydrogen atom, linear, branched or cyclic alkyl group, linear, branched or cyclic alkoxy group, hydroxyl group or halogen atom, and $X^-$ is an alkyl group, aryl group, halogen-substituted alkyl group or halogen-substituted aryl group.

Illustrative examples of the onium salt compound are given below.

a. Sulfonium Salt triphenylsulfonium trifluoromethanesulfonate, triphenylsulfonium nonafluoro-n-butanesulfonate, triphenylsulfonium perfluoro-n-octanesulfonate, triphenylsulfonium p-toluenesulfonate, triphenylsulfonium benzenesulfonate, triphenylsulfonium 10-camphorsulfonate, triphenylsulfonium n-dodecylbenzenesulfonate, triphenylsulfonium-2-trifluoromethylbenzenesulfonate, triphenylsulfonium-4-trifluoromethylbenzenesufonate, triphenylsulfonium-2,4-difluorobenzenesulfonate, triphenylsulfonium pentafluorobenzenesulfonate, triphenylsulfonium-1-naphthalenesulfonate, diphenyl-4-methylphenylsulfonium trifuloromethanesulfonate, diphenyl-4-methylphenylsulfonium nonafluoro-n-butanesulfonate, diphenyl-4-methylphenylsulfonium perfluoro-n-octanesulfonate, diphenyl-4-methylphenylsulfonium p-toluenesulfonate, diphenyl-4-methylphenylsulfonium 10-camphorsulfonate, diphenyl-2,4-dimethylphenylsulfonium trifluoromethanesulfonate, diphenyl-2,4-dimethylphenylsulfonium nonafluoro-n-butanesulfonate, diphenyl-2,4-dimethylphenylsulfonium perfluoro-n-octanesulfonate, diphenyl-2,4-dimethylphenylsulfonium p-toluenesulfonate, diphenyl-2,4-dimethylphenylsulfonium 10-camphorsulfonate, diphenyl-2,4,6-trimethylphenylsulfonium trifluoromethanesulfonate, diphenyl-2,4,6-trimethylphenylsulfonium nonafluoro-n-butanesulfonate, diphenyl-2,4,6-trimethylphenylsulfonium perfluoro-n-octanesulfonate, diphenyl-2,4,6-trimethylphenylsulfonium p-toluenesulfonate, diphenyl-2,4,6-trimethylphenylsulfonium 10-camphorsulfonate, diphenyl-4-t-butylphenylsulfonium trifluoromethanesulfonate, diphenyl-4-t-butylphenylsulfonium nonafluoro-n-butanesulfonate, diphenyl-4-t-butylphenylsulfonium perfluoro-n-octanesulfonate, diphenyl-4-t-butylphenylsulfonium p-toluenesulfonate, diphenyl-4-t-butylphenylsulfonium-10-camphorsufonate, diphenyl-4-fluorophenylsulfonium trifluoromethanesulfonate, diphenyl-4-fluorophenylsulfonium nonafluoro-n-butanesulfonate, diphenyl-4-fluorophenylsulfonium perfluoro-n-octanesulfonate, diphenyl-4-fluorophenylsulfonium p-toluenesulfonate, diphenyl-4-fluorophenylsulfonium-10-camphorsulfonate, diphenyl-4-hydroxyphenylsulfonium trifluoromethanesulfonate, diphenyl-4-hydroxyphenylsulfonium nonafluoro-n-butanesulfonate, diphenyl-4-hydroxyphenylsulfonium perfluoro-n-octanesulfonate, diphenyl-4-hydroxyphenylsulfonium p-toluenesulfonate, diphenyl-4-hydroxyphenylsulfonium-10-camphorsulfonate, diphenyl-4-methoxyphenylsulfonium trifluoromethanesulfonate, diphenyl-4-methoxyphenylsulfonium nonafluoro-n-butanesulfonate, diphenyl-4-methoxyphenylsulfonium perfluoro-n-octanesulfonate, diphenyl-4-methoxyphenylsulfonium p-toluenesulfonate, diphenyl-4-methoxyphenylsulfonium-10-camphorsulfonate, diphenyl-4-t-butoxyphenylsulfonium trifluoromethanesulfonate, diphenyl-4-t-butoxyphenylsulfonium nonafluoro-n-butanesulfonate, diphenyl-4-t-butoxyphenylsulfonium perfluoro-n-octanesulfonate, diphenyl-4-t-butoxyphenylsulfonium p-toluenesulfonate, diphenyl-4-t-butoxyphenylsulfonium-10-camphorsulfonate, bis(4-fluorophenyl)-phenylsulfonium trifluoromethanesulfonate, bis(4-fluorophenyl)-4-hydroxyphenylsulfonium trifluoromethanesulfonate, bis(4-fluorophenyl)-4-methoxyphenylsulfonium trifluoromethanesulfonate, bis(4-hydroxyphenyl)-phenylsulfonium trifluoromethanesulfonate, bis(4-hydroxyphenyl)-4-methoxyphenylsulfonium trifluoromethanesulfonate, bis(4-methoxyphenyl)-phenylsulfonium trifluoromethanesulfonate, bis(4-methoxyphenyl)-4-hydroxyphenylsulfonium trifluoromethanesulfonate, tris(4-fluorophenyl)sulfonium trifluoromethanesulfonate, tris(4-hydroxyphenyl)sulfonium trifluoromethanesulfonate, tris(4-methoxyphenyl)sulfonium trifluoromethanesulfonate, tris(4-methoxyphenyl)sulfonium nonafluoro-n-butanesulfonate, tris(4-methoxyphenyl)sulfonium perfluoro-n-octanesulfonate, tris(4-methoxyphenyl)sulfonium p-toluenesulfonate and tris(4-methoxyphenyl)sulfonium-10-camphorsulfonate.

b. Iodonium Salt bis(4-t-butylphenyl)iodonium trifluoromethanesulfonate, bis(4-t-butylphenyl)iodonium nonafluoro-n-butanesulfonate, bis(4-t-butylphenyl)Iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium pentafluorobenzenesulfonate, bis(3,4-dimethylphenyl)iodonium trifluoromethanesulfonate, bis(3,4-dimethylphenyl)iodonium nonafluoro-n-butanesulfonate, bis(3,4-dimethylphenyl)iodonium perfluoro-n-octanesulfonate, bis(3,4-dimethylphenyl)iodonium p-toluenesulfonate, bis(3,4-dimethylphenyl)iodonium benzenesulfonate, bis(3,4-dimethylphenyl)iodonium 10-camphorsulfonate, bis(3,4-dimethylphenyl)iodonium-2-trifluoromethylbenzenesulfonate, bis(3,4-dimethylphenyl)iodonium-4-trifluoromethylbenzenesulfonate, bis(3,4-dimethylphenyl)iodonium-2,4-difluorobenzenesulfonate, bis(3,4-dimethylphenyl)iodonium pentafluorobenzenesulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzensulfonate, diphenyliodonium pentafluorobenzenesulfonate, 4-nitrophenyl•phenyliodonium trifluoromethanesulfonate, 4-nitrophenyl•phenyliodonium nonafluoro-n-butanesulfonate, 4-nitrophenyl•phenyliodonium perfluoro-n-octanesulfonate, 4-nitrophenyl•phenyliodonium p-toluenesulfonate, 4-nitrophenyl•phenyliodonium benzenesulfonate, 4-nitrophenyl•phenyliodonium 10-camphorsulfonate, bis(3-nitrophenyl)iodonium trifluoromethanesulfonate, bis (3-nitrophenyl)iodonium nonafluoro-n-butanesulfonate, bis(3-nitrophenyl)iodonium perfluoro-n-octanesulfonate, bis(3-nitrophenyl)iodonium p-toluenesulfonate, bis(3-nitrophenyl)iodonium benzenesulfonate, bis(3-nitrophenyl)iodonium 10-camphorsulfonate, 4-methoxyphenyl•phenyliodonium trifluoromethanesulfonate, 4-methoxyphenyl•phenyliodonium nonafluoro-n-butanesulfonate, 4-methoxyphenyl•phenyliodonium perfluoro-n-octanesulfonate, 4-methoxyphenyl•phenyliodonium p-toluenesulfonate, 4-methoxyphenyl•phenyliodonium benzenesulfonate, 4-methoxyphenyl•phenyliodonium 10-camphorsulfonate, bis(4-chlorophenyl)iodonium trifluoromethanesulfonate, bis(4-chlorophenyl)iodonium nonafluoro-n-butanesulfonate, bis(4-chlorophenyl)iodonium perfluoro-n-octanesulfonate, bis(4-chlorophenyl)iodonium p-toluenesulfonate, bis(4-chlorophenyl)iodonium benzenesulfonate, bis(4-chlorophenyl)iodonium 10-camphorsulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium p-toluenesulfonate, bis(4-trifluoromethylphenyl)iodonium benzenesulfonate and bis(4-trifluoromethylphenyl)iodonium 10-camphorsulfonate (2) Sulfonimide Compound:

The sulfonimide compound is, for example, a compound represented by the following formula (3).

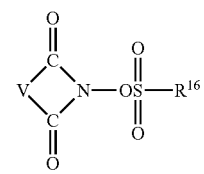

(3)

In the formula (3), V is a divalent group such as alkylene group, arylene group or alkoxylene group, and $R^{16}$ is a monovalent group such as alkyl group, aryl group, halogen-substituted alkyl group or halogen-substituted aryl group.

Illustrative examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide, N-(trifluoromethylsulfonyloxy)naphthylimide, N-(nonafluoro-n-butanesulfonyloxy)succinimide, N-(nonafluoro-n-butanesulfonyloxy)phthalimide, N-(nonafluoro-n-butanesulfonyloxy)diphenylmaleimide, N-(nonafluoro-n-butanesulfonyloxy)bicyclo[2.2.1]hept-5-ene-2,3-dicarboxyimide, N-(nonafluoro-n-butanesulfonyloxy)-7-oxabicyclo[2.2.1]hept-5-ene-2,3-dicarboxyimide, N-(nonafluoro-n-butanesulfonyloxy) bicyclo[2.2.1]heptan-5,6-oxy-2,3-dicarboxyimide, N-(nonafluoro-n-butanesulfonyloxy)naphthylimide, N-(perfluoro-n-octanesulfonyloxy)succinimide, N-(perfluoro-n-octanesulfonyloxy) phthalimide, N-(perfluoro-n-octanesulfonyloxy)

diphenylmaleimide, N-(perfluoro-n-octanesulfonyloxy)bicyclo[2.2.1]hept-5-ene-2,3-dicarboxyimide, N-(perfluoro-n-octanesulfonyloxy)-7-oxabicyclo[2.2.1]hept-5-ene-2,3-dicarboxyimide, N-(perfluoro-n-octanesulfonyloxy)bicyclo[2.2.1]heptan-5,6-oxy-2,3-dicarboxyimide, N-(perfluoro-n-octanesulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-(n-octanesulfonyloxy)succinimide, N-(n-octanesulfonyloxy)phthalimide, N-(n-octanesulfonyloxy)diphenylmaleimide, N-(n-octanesulfonyloxy)bicyclo[2.2.1]hept-5-ene-2,3-dicarboxyimide, N-(n-octanesulfonyloxy)-7-oxabicyclo[2.2.1]hept-5-ene-2,3-dicarboxyimide, N-(n-octanesulfonyloxy)bicyclo[2.2.1]heptan-5,6-oxy-2,3-dicarboxyimide, N-(n-octanesulfonyloxy)naphthylimide, N-(p-toluenesulfonyloxy)succinimide, N-(p-toluenesulfonyloxy)phthalimide, N-(p-toluenesulfonyloxy)diphenylmaleimide, N-(p-toluenesulfonyloxy)bicyclo[2.2.1]hept-5-ene-2,3-dicarboxyimide, N-(p-toluenesulfonyloxy)-7-oxabicyclo[2.2.1]hept-5-ene-2,3-dicarboxyimide, N-(p-toluenesulfonyloxy)bicyclo[2.2.1]heptan-5,6-oxy-2,3-dicarboxyimide, N-(p-toluenesulfonyloxy)naphthylimide, N-(2-trifluoromethylbenzenesulfonyloxy)succinimide, N-(2-trifuoromethylbenzenesulfonyloxy)phthalimide, N-(2-trifluoromethylbenzenesulfonyloxy)diphenylmaleimide, N-(2-trifluoromethylbenzenesulfonyloxy)bicyclo[2.2.1]hept-5-ene-2,3-dicarboxyimide, N-(2-trifluoromethylbenzenesulfonyloxy)-7-oxabicyclo [2.2.1]hept-5-ene-2,3-dicarboxyimide, N-(2-trifluoromethylbenzenesulfonyloxy)bicyclo[2.2.1]heptan-5,6-oxy-2,3-dicarboxyimide, N-(2-trifluoromethylbenzenesulfonyloxy)naphthylimide, N-(4-trifluoromethylbenzenesulfonyloxy)succinimide, N-(4-trifluoromethylbenzenesulfonyloxy)phthalimide, N-(4-trifluoromethylbenzenesulfonyloxy)diphenylmaleimide, N-(4-trifluoromethylbenzenesulfonyloxy)bicyclo[2.2.1]hept-5-ene-2,3-dicarboxyimide, N-(4-trifluoromethylbenzenesulfonyloxy)-7-oxabicyclo[2.2.1]hept-5-ene-2,3-dicarboxyimide, N-(4-trifluoromethylbenzenesulfonyloxy)bicyclo[2.2.1]heptan-5,6-oxy-2,3-dicarboxyimide, N-(4-trifluoromethylbenzenesulfonyloxy)naphthylimide, N-(pentafluorobenzenesulfonyloxy)succinimide, N-(pentafluorobenzenesulfonyloxy)phthalimide, N-(pentafluorobenzenesulfonyloxy)diphenylmaleimide, N-(pentafluorobenzenesulfonyloxy)bicyclo[2.2.1]hept-5-ene-2,3-dicarboxyimide, N-(pentafluorobenzenesulfonyloxy)-7-oxabicyclo[2.2.1]hept-5-ene-2,3-dicarboxyimide, N-(pentafluorobenzenesulfonyloxy)bicyclo[2.2.1]heptan-5,6-oxy-2,3-dicarboxyimide, N-(pentafluorobenzenesulfonyloxy)naphthylimide, N-(benzenesulfonyloxy)succinimide, N-(benzenesulfonyloxy)phthalimide, N-(benzenesulfonyloxy)diphenylmaleimide, N-(benzenesulfonyloxy)bicyclo[2.2.1]hept-5-ene-2,3-dicarboxyimide, N-(benzenesulfonyloxy)-7-oxabicyclo[2.2.1]hept-5-ene-2,3-dicarboxyimide, N-(benzenesulfonyloxy)bicyclo[2.2.1]heptan-5,6-oxy-2,3-dicarboxyimide, N-(benzenesulfonyloxy)naphthylimide, N-(1-naphthalenesulfonyloxy)succinimide, N-(1-naphthalenesulfonyloxy)phthalimide, N-(1-naphthalenesulfonyloxy)diphenylmaleimide, N-(1-naphthalenesulfonyloxy)bicyclo[2.2.1]hept-5-ene-2,3-dicarboxyimide, N-(1-naphthalenesulfonyloxy)-7-oxabicyclo[2.2.1]hept-5-ene-2,3-dicarboxyimide, N-(1-naphthalenesulfonyloxy)bicyclo[2.2.1]heptan-5,6-oxy-2,3-dicarboxyimide and N-(1-naphthalenesulfonyloxy)naphthylimide (3) Diazomethane Compound:

The diazomethane compound is, for example, a compound represented by the following formula (4).

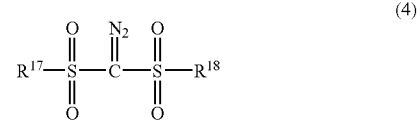

In the formula (4), $R^{17}$ and $R^{18}$ are each independently a monovalent group such as alkyl group, aryl group, halogen-substituted alkyl group or halogen-substituted aryl group.

Illustrative examples of the diazomethane compound include bis(trifluoromethylsulfonyl)diazomethane, bis(cyclohexylsulfonyl)diazomethane, bis(phenylsulfonyl)diazomethane, bis(4-toluenesulfonyl)diazomethane, bis(2,4-dimethylbenzenesulfonyl)diazomethane, methylsulfonyl•p-toluenesulfonyl diazomethane, bis(4-t-butylphenylsulfonyl)diazomethane, bis(4-chlorobenzenesulfonyl)diazomethane, cyclohexylsulfonyl•p-toluenesulfonyl diazomethane, 1-cyclohexylsulfonyl•1,1-dimethylethylsulfonyl diazomethane, bis(1,1-dimethylethylsulfonyl)diazomethane, bis(1-methylethylsulfonyl)diazomethane, bis(3,3-dimethyl-1,5-dioxaspiro[5.5]dodecane-8-sulfonyl)diazomethane and bis(1,4-dioxaspiro[4.5]decane-7-sulfonyl)diazomethane.

(4) Disulfonylmethane Compound:

The disulfonylmethane compound is, for example, a compound represented by the following formula (5).

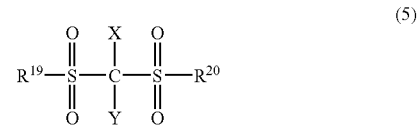

In the formula (5), $R^{19}$ and $R^{20}$ are each independently a monovalent linear or branched aliphatic hydrocarbon group or another monovalent organic group having a cycloalkyl group, aryl group, aralkyl group or hetero atom, and X and Y are each independently an aryl group, hydrogen atom, monovalent linear or branched aliphatic hydrocarbon group, or another monovalent organic group having a hetero atom (at least one of X and Y is an aryl group), or X and Y are bonded together to form a carbon monocyclic structure or carbon polycyclic structure having at least one unsaturated bond, or X and Y are bonded together to form a group represented by the following formula (6):

wherein X' and Y' are each independently a hydrogen atom, halogen atom, alkyl group, cycloalkyl group, aryl group or aralkyl group, or they form a carbon monocyclic structure with a carbon atom bonded thereto, and m is an integer of 2 to 10.

(5) Halogen-Containing Compound

The halogen-containing compound is preferably a hydrocarbon compound having a haloalkyl group or heterocyclic compound having a haloalkyl group.

Illustrative examples of the halogen-containing compound include bromine compounds such as tris(2,3-dibromopropyl)isocyanurate, α,α,α-tribromomethylphenylsulfone, tribromoneopentyl alcohol, 2,2-bis(bromomethyl)-1,3-propanediol, pentaerythritol tetrabromide, 2-(bromomethyl)-2-(hydroxymethyl)-1,3-propanediol, hexabromohexane, hexabromoheptane, hexabromocyclododecane, tetrabromo-o-cresol, tetrabromobisphenol A bishydroxyethyl ether and 2,4-dibromo-2,4-dimethyl-3-pentanone; (trichloromethyl)-s-triazine derivatives such as pentaerythritol tetrachloride, phenyl-bis-(trichloromethyl)-s-triazine, methoxyphenyl-bis(trichloromethyl)-s-triazine and naphthyl-bis(trichloromethyl)-s-triazine; chlorine compounds such as 1,1-bis(4-chlorophenyl)-2,2,2-trichloroethane; and iodine compounds such as hexaiodohexane and p-diiodobenzene.

(6) Sulfone Compound

The sulfone compound is, for example, a β-ketosulfone, β-sulfonylsulfone or α-diazo compound thereof.

Illustrative examples of the sulfone compound include phenacyl phenyl sulfone, mesityl phenacyl sulfone, bis(phenylsufonyl)methane and 4-trisphenacyl sulfone.

(7) Sulfonic Acid Ester Compound

The sulfonic acid ester compound is, for example, an alkyl sulfonic acid ester, haloalkyl sulfonic acid ester, aryl sulfonic acid ester or iminosulfonate.

Illustrative examples of the sulfonic acid ester compound include benzoin tosylate, pyrogallol tristriflate, pyrogallol methane sulfonic acid triester, nitrobenzyl-9,10-diethoxyanthracene-2-sulfonate, α-methylolbenzoin tosylate, α-methylolbenzoin octanesulfonic acid ester, α-methylolbenzoin trifluoromethane sulfonic acid ester and α-methylolbenzoin dodecylsulfonic acid ester.

(8) Oxime Sulfonate Compound

The oxime sulfonate compound is, for example, a compound represented by the following formula (7).

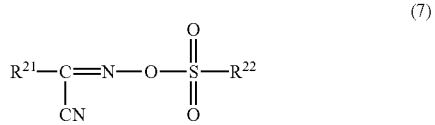

(7)

In the formula (7), $R^{21}$ and $R^{22}$ are each independently a linear, branched or cyclic alkyl group which may be substituted, aryl group which may be substituted, heteroaryl group which may be substituted or aralkyl group which may be substituted.

Illustrative examples of the oxime sulfonate compound include α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methoxyphenylacetonitrile and α-(methylsulfonyloxyimino)-4-bromophenylacetonitrile.

The above acid generating agents (B) in the present invention may be used alone or in combination of two or more.

Out of the above acid generating agents (B) in the present invention, onium salts and sulfonic acid imides are preferred, onium salts are more preferred, and onium salts containing a phenolic hydroxyl group are particularly preferred.

Out of the above onium salts having a phenolic hydroxyl group, preferred are diphenyl-4-hydroxyphenylsulfonium trifluoromethansulfonate, diphenyl-4-hydroxyphenylsulfonium nonafluoro-n-butanesulfonate, diphenyl-4-hydroxyphenylsulfonium perfluoro-n-octanesulfonate, diphenyl-4-hydroxyphenylsulfonium p-toluenesulfonate, diphenyl-4-hydroxyphenylsulfonium-10-camphorsulfonate, bis(4-fluorophenyl)-4-hydroxyphenylsulfonium trifluoromethanesulfonate, bis(4-hydroxyphenyl)-phenylsulfonium trifluoromethanesulfonate, bis(4-hydroxyphenyl)-4-methoxyphenylsulfonium trifluoromethanesulfonate, bis(4-methoxyphenyl)-4-hydroxyphenylsulfonium trifluoromethanesulfonate and tris(4-hydroxyphenyl)sulfonium trifuloromethanesulfonate.

A resist pattern having excellent balance among sensitivity, resolution and a defect can be formed by using a mixture of an onium salt having a phenolic hydroxyl group and another onium salt. When an onium salt mixture is used, the amount of the onium salt having a phenolic hydroxyl group is preferably 20 to 80 wt % based on the whole acid generating agent (B).

In the present invention, the amount of the acid generation agent (B) is preferably 0.1 to 20 parts by weight, more preferably 0.5 to 15 parts by weight, much more preferably 1 to 10 parts by weight based on 100 parts by weight of the alkali-soluble resin (A). When the amount of the acid generating agent (B) is smaller than 0.1 part by weight, the resolution lowers and when the amount is larger than 20 parts by weight, the sectional form of the pattern worsens.

Acid Crosslinking Agent (C)

The acid crosslinking agent (C) in the present invention is not limited to a particular kind if it crosslinks the alkali-soluble resin (A) in the presence of an acid, for example, an acid generated by exposure to suppress its solubility in an alkali developer. Examples of the acid crosslinking agent include an N-(alkoxymethyl)glycoluril compound represented by the following formula (8), N-(alkoxymethyl)urea compound represented by the following formula (9), N-(alkoxymethyl)melamine compound represented by the following formula (10), N-(alkoxymethyl)amino compound such as N-(alkoxymethyl)ethyleneurea compound represented by the following formula (11), and compounds having an α-hydroxyisopropyl group represented by the following formulas (12), (13), (14) and (15) and/or an acid dissociating derivative of an α-hydroxyisopropyl group.

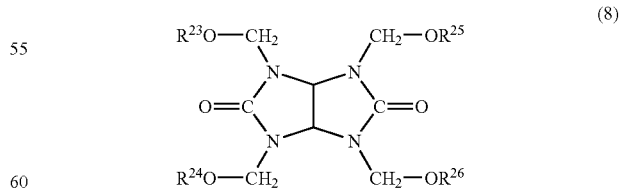

(8)

In the formula (8), $R^{23}$ to $R^{26}$ are each independently an alkyl group having 1 to 4 carbon atoms.

Illustrative examples of the N-(alkoxymethyl)glycoluril compound represented by the formula (8) include N,N,N,N-tetra(methoxymethyl)glycoluril, N,N,N,N-tetra (ethoxymethyl)glycoluril, N,N,N,N-tetra(n-propoxymethyl) glycoluril, N,N,N,N-tetra(i-propoxymethyl)glycoluril, N,N,N,N-tetra(n-butoxymethyl)glycoluril and N,N,N,N-tetra(t-butoxymethyl)glycoluril.

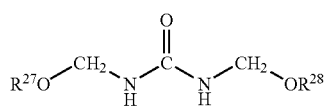

(9)

In the formula (9), $R^{27}$ and $R^{28}$ are each independently an alkyl group having 1 to 4 carbon atoms.

Illustrative examples of the N-(alkoxymethyl)urea compound represented by the formula (9) include N,N-di(methoxymethyl)urea, N,N-di(ethoxymethyl)urea, N,N-di(n-propoxymethyl)urea, N,N-di(i-propoxymethyl)urea, N,N-di(n-butoxymethyl)urea and N,N-di(t-butoxymethyl)urea.

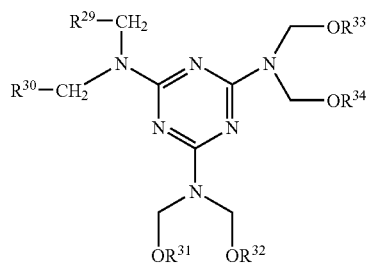

(10)

In the formula (10), $R^{29}$ to $R^{34}$ are each independently an alkyl group having 1 to 4 carbon atoms.

Illustrative examples of the N-(alkoxymethyl)melamine compound represented by the formula (10) include N,N,N,N,N,N-hexa(methoxymethyl)melamine, N,N,N,N,N,N-hexa(ethoxymethyl)melamine, N,N,N,N,N,N-hexa(n-propoxymethyl)melamine, N,N,N,N,N,N-hexa(i-propoxymethyl)melamine, N,N,N,N,N,N-hexa(n-butoxymethyl)melamine and N,N,N,N,N,N-hexa(t-butoxymethyl)melamine.

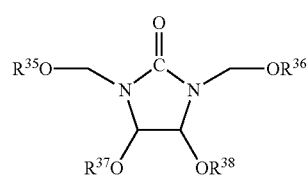

(11)

In the formula (11), $R^{35}$ to $R^{38}$ are each independently an alkyl group having 1 to 4 carbon atoms.

Illustrative examples of the N-(alkoxymethyl)ethyleneurea compound represented by the formula (11) include N,N-di(methoxymethyl)-4,5-di(methoxymethyl)ethyleneurea, N,N-di(ethoxymethyl)-4,5-di(ethoxymethyl)ethyleneurea, N,N-di(n-propoxymethyl)-4,5-di(n-propoxymethyl)ethyleneurea, N,N-di(i-propoxymethyl)-4,5-di(i-propoxymethylmethyl)ethyleneurea, N,N-di(n-butoxymethyl)-4,5-di(n-butoxymethyl)ethyleneurea and N,N-di(t-butoxymethyl)-4,5-di(t-butoxymethylmethyl)ethyleneurea.

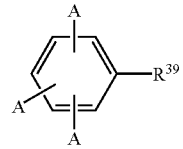

(12)

In formula (12), As are each independently an α-hydroxyisopropyl group or hydrogen atom, with the proviso that at least one A is an α-hydroxyisopropyl group, and $R^{39}$ is a hydrogen atom, hydroxyl group, linear or branched alkylcarbonyl group having 2 to 6 carbon atoms, or linear or branched alkoxycarbonyl group having 2 to 6 carbon atoms.

Illustrative examples of the compound represented by the formula (12) include α-hydroxyisopropylbenzenes such as α-hydroxyisopropylbenzene, 1,3-bis(α-hydroxyisopropyl)benzene, 1,4-bis(α-hydroxyisopropyl)benzene, 1,2,4-tris(α-hydroxyisopropyl)benzene and 1,3,5-tris(α-hydroxyisopropyl)benzene; α-hydroxyisopropylphenols such as 3-α-hydroxyisopropylphenol, 4-α-hydroxyisopropylphenol, 3,5-bis(α-hydroxyisopropyl)phenol and 2,4,6-tris(α-hydroxyisopropyl)phenol; α-hydroxyisopropylphenyl•alkyl ketones such as 3-α-hydroxyisopropylphenyl•methyl ketone, 4-α-hydroxyisopropylphenyl•methyl ketone, 4-α-hydroxyisopropylphenyl•ethyl ketone, 4-α-hydroxyisopropylphenyl•n-propyl ketone, 4-α-hydroxyisopropylphenyl•isopropyl ketone, 4-α-hydroxyisopropylphenyl•n-butyl ketone, 4-α-hydroxyisopropylphenyl•t-butyl ketone, 4-α-hydroxyisopropylphenyl•n-pentyl ketone, 3,5-bis(α-hydroxyisopropyl)phenyl•methyl ketone, 3,5-bis(α-hydroxyisopropyl)phenyl•ethyl ketone and 2,4,6-tris(α-hydroxyisopropyl)phenyl•methyl ketone; and 4-α-hydroxyisopropylbenzoic acid alkyls such as methyl 3-α-hydroxyisopropylbenzoate, methyl 4-α-hydroxyisopropylbenzoate, ethyl 4-α-hydroxyisopropylbenzoate, n-propyl 4-α-hydroxyisopropylbenzoate, isopropyl 4-α-hydroxyisopropylbenzoate, n-butyl 4-α-hydroxyisopropylbenzoate, t-butyl 4-α-hydroxyisopropylbenzoate, n-pentyl 4-α-hydroxyisopropylbenzoate, methyl 3,5-bis(α-hydroxyisopropyl)benzoate, ethyl 3,5-bis(α-hydroxyisopropyl)benzoate and methyl 2,4,6-tris(α-hydroxyisopropyl)benzoate.

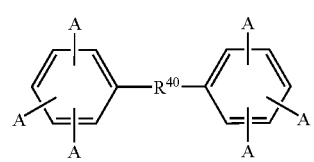

(13)

In the formula (13), As are each independently an α-hydroxyisopropyl group or hydrogen atom, with the proviso that at least one A is an α-hydroxyisopropyl group, and $R^{40}$ is a single bond, linear or branched alkylene group having 1 to 5 carbon atoms, —O—, —CO— or —COO—.

Illustrative examples of the compound represented by the formula (13) include α-hydroxyisopropylbiphenyls such as 3-α-hydroxyisopropylbiphenyl, 4-α-hydroxyisopropylbiphenyl, 3,5-bis(α-hydroxyisopropyl)biphenyl, 3,3'-bis(α- hydroxyisopropyl)biphenyl, 3,4'-bis(α-hydroxyisopropyl)biphenyl, 4,4'-bis(α-hydroxyisopropyl)biphenyl, 2,4,6-tris(α-hydroxyisopropyl)biphenyl, 3,3',5-tris(α-hydroxyisopropyl)biphenyl, 3,4',5-tris(α-hydroxyisopropyl)biphenyl, 2,3',4,6-tetrakis(α-hydroxyisopropyl)biphenyl, 2,4,4',6-tetrakis(α-hydroxyisopropyl)biphenyl, 3,3',5,5'-tetrakis(α-hydroxyisopropyl)biphenyl, 2,3',4,5',6-pentakis(α-hydroxyisopropyl)biphenyl and 2,2',4,4',6,6'-hexakis(α-hydroxyisopropyl)biphenyl;

α-hydroxyisopropyldiphenylalkanes such as 3-α-hydroxyisopropyldiphenylmethane, 4-α-hydroxyisopropyldiphenylmethane, 1-(4-α-hydroxyisopropylphenyl)-2-phenylethane, 1-(4-α-hydroxyisopropylphenyl)-2-phenylpropane, 2-(4-α-hydroxyisopropylphenyl)-2-phenylpropane, 1-(4-α-hydroxyisopropylphenyl)-3-phenylpropane, 1-(4-α-hydroxyisopropylphenyl)-4-phenylbutane, 1-(4-α-hydroxyisopropylphenyl)-5-phenylpentane, 3,5-bis(α-hydroxyisopropyl)diphenylmethane, 3,3'-bis(α-hydroxyisopropyl)diphenylmethane, 3,4'-bis(α-hydroxyisopropyl)diphenylmethane, 4,4'-bis(α-hydroxyisopropyl)diphenylmethane, 1,2-bis(4-α-hydroxyisopropylphenyl)ethane, 1,2-bis(4-α-hydroxyisopropylphenyl)propane, 2,2-bis(4-α-hydroxyisopropylphenyl)propane, 1,3-bis(4-α-hydroxyisopropylphenyl)propane, 2,4,6-tris(α-hydroxyisopropyl)diphenylmethane, 3,3',5-tris(α-hydroxyisopropyl)diphenyl methane, 3,4',5-tris(α-hydroxyisopropyl)diphenylmethane, 2,3',4,6-tetrakis(α-hydroxyisopropyl)diphenylmethane, 2,4,4',6-tetrakis(α-hydroxyisopropyl )diphenylmethane, 3,3',5,5'-tetrakis(α-hydroxyisopropyl)diphenylmethane, 2,3',4,5',6-pentakis(α-hydroxyisopropyl)diphenylmethane and 2,2',4,4',6,6'-hexakis(α-hydroxyisopropyl)diphenylmethane;

α-hydroxyisopropyldiphenyl ethers such as 3-α-hydroxyisopropyldiphenyl ether, 4-α-hydroxyisopropyldiphenyl ether, 3,5-bis(α-hydroxyisopropyl)diphenyl ether, 3,3'-bis(α-hydroxyisopropyl)diphenyl ether, 3,4'-bis(α-hydroxyisopropyl)diphenyl ether, 4,4'-bis(α-hydroxyisopropyl)diphenyl ether, 2,4,6-tris(α-hydroxyisopropyl)diphenyl ether, 3,3',5-tris(α-hydroxyisopropyl)diphenyl ether, 3,4',5-tris(α-hydroxyisopropyl)diphenyl ether, 2,3',4,6-tetrakis(α-hydroxyisopropyl)diphenyl ether, 2,4,4',6-tetrakis(α-hydroxyisopropyl)diphenyl ether, 3,3',5,5'-tetrakis(α-hydroxyisopropyl)diphenyl ether, 2,3',4,5',6-pentakis(α-hydroxyisopropyl)diphenyl ether and 2,2',4,4',6,6'-hexakis(α-hydroxyisopropyl)diphenyl ether;

α-hydroxyisopropyldiphenyl ketones such as 3-α-hydroxyisopropyldiphenyl ketone, 4-α-hydroxyisopropyldiphenyl ketone, 3,5-bis(α-hydroxyisopropyl)diphenyl ketone, 3,3'-bis(α-hydroxyisopropyl)diphenyl ketone, 3,4-bis(α-hydroxyisopropyl)diphenyl ketone, 4,4'-bis(α-hydroxyisopropyl)diphenyl ketone, 2,4,6-tris(α-hydroxyisopropyl)diphenyl ketone, 3,3',5-tris(α-hydroxyisopropyl)diphenyl ketone, 3,4',5-tris(α-hydroxyisopropyl)diphenyl ketone, 2,3',4,6-tetrakis(α-hydroxyisopropyl)diphenyl ketone, 2,4,4',6-tetrakis(α-hydroxyisopropyl)diphenyl ketone, 3,3',5,5'-tetrakis(α-hydroxyisopropyl)diphenyl ketone, 2,3',4,5',6-pentakis(α-hydroxyisopropyl )diphenyl ketone and 2,2',4,4',6,6'-hexakis(α-hydroxyisopropyl)diphenyl ketone; and α-hydroxyisopropylbenzoic acid phenyls such as 3-α-hydroxyisopropylbenzoic acid phenyl, 4-α-hydroxyisopropylbenzoic acid phenyl, benzoic acid 3-α-hydroxyisopropylphenyl, benzoic acid 4-α-hydroxyisopropylphenyl, 3,5-bis(α-hydroxyisopropyl)benzoic acid phenyl, 3-α-hydroxyisopropylbenzoic acid 3-α-hydroxyisopropylphenyl, 3-α-hydroxyisopropylbenzoic acid 4-α-hydroxyisopropylphenyl, 4-α-hydroxyisopropylbenzoic acid 3-α-hydroxyisopropylphenyl, 4-α-hydroxyisopropylbenzoic acid 4-α-hydroxyisopropylphenyl, benzoic acid 3,5-bis(α-hydroxyisopropyl)phenyl, 2,4,6-tris(α-hydroxyisopropyl)benzoic acid phenyl, 3,5-bis(α-hydroxyisopropyl)benzoic acid 3-α-hydroxyisopropylphenyl, 3,5-bis(α-hydroxyisopropyl)benzoic acid 4-α-hydroxyisopropylphenyl, 3-α-hydroxyisopropylbenzoic acid 3,5-bis(α-hydroxyisopropyl)phenyl, 4-α-hydroxyisopropylbenzoic acid 3,5-bis(α-hydroxyisopropyl)phenyl, benzoic acid 2,4,6-tris(α-hydroxyisopropyl)phenyl, 2,4,6-tris(α-hydroxyisopropyl)benzoic acid 3-α-hydroxyisopropylphenyl, 2,4,6-tris(α-hydroxyisopropyl)benzoic acid 4-α-hydroxyisopropylphenyl, 3,5-bis(α-hydroxyisopropyl)benzoic acid 3,5-bis(α-hydroxyisopropyl)phenyl, 3-α-hydroxyisopropylbenzoic acid 2,4,6-tris(α-hydroxyisopropyl)phenyl, 4-α-hydroxyisopropylbenzoic acid 2,4,6-tris(α-hydroxyisopropyl)phenyl, 2,4,6-tris(α-hydroxyisopropyl)benzoic acid 3,5-bis(α-hydroxyisopropyl)phenyl, 3,5-bis(α-hydroxyisopropyl)benzoic acid 2,4,6-tris (α-hydroxyisopropyl)phenyl and 2,4,6-tris(α-hydroxyisopropyl)benzoic acid 2,4,6-tris(α-hydroxyisopropyl)phenyl.

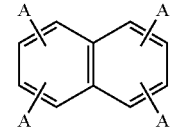

(14)

In the formula (14), As are each independently an α-hydroxyisopropyl group or hydrogen atom, with the proviso that at least one A is an α-hydroxyisopropyl group.

Illustrative examples of the compound represented by the formula (14) include 1-(α-hydroxyisopropyl)naphthalene, 2-(α-hydroxyisopropyl)naphthalene, 1,3-bis(α-hydroxyisopropyl)naphthalene, 1,4-bis(α-hydroxyisopropyl)naphthalene, 1,5-bis(α-hydroxyisopropyl)naphthalene, 1,6-bis(α-hydroxyisopropyl)naphthalene, 1,7-bis(α-hydroxyisopropyl)naphthalene, 2,6-bis(α-hydroxyisopropyl)naphthalene, 2,7-bis(α-hydroxyisopropyl)naphthalene, 1,3,5-tris(α-hydroxyisopropyl)naphthalene, 1,3,6-tris(α-hydroxyisopropyl)naphthalene, 1,3,7-tris(α-hydroxyisopropyl)naphthalene, 1,4,6-tris(α-hydroxyisopropyl)naphthalene, 1,4,7-tris(α-hydroxyisopropyl)naphthalene and 1,3,5,7-tetrakis(α-hydroxyisopropyl)naphthalene.

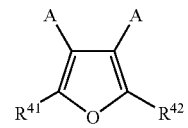

(15)

In the formula (15), As are each independently an α-hydroxyisopropyl group or hydrogen atom, with the proviso that at least one A is an α-hydroxyisopropyl group, and $R^{41}$ and $R^{42}$ are each independently a hydrogen atom or linear or branched alkyl group having 1 to 5 carbon atoms.

Illustrative examples of the compound represented by the formula (15) include 3-(α-hydroxyisopropyl )furan, 2-methyl-3-(α-hydroxyisopropyl)furan, 2-methyl-4-(α-hydroxyisopropyl)furan, 2-ethyl-4-(α-hydroxyisopropyl)furan, 2-n- propyl-4-(α-hydroxyisopropyl)furan, 2-isopropyl-4-(α-hydroxyisopropyl)furan, 2-n-butyl-4-(α-hydroxyisopropyl)furan, 2-t-butyl-4-(α-hydroxyisopropyl)furan, 2-n-pentyl-4-(α-hydroxyisopropyl)furan, 2,5-dimethyl-3-(α-hydroxyisopropyl)furan, 2,5-diethyl-3-(α-hydroxyisopropyl)furan, 3,4-bis(α-hydroxyisopropyl)furan, 2,5-dimethyl-3,4-bis(α-hydroxyisopropyl)furan and 2,5-diethyl-3,4-bis(α-hydroxyisopropyl)furan.

The α-hydroxyisopropyl group-containing compounds represented by the formulas (12), (13), (14) and (15) can be synthesized by the following methods (1) and (2).

(1) An acetyl group-containing compound such as 1,3-diacetylbenzene is reacted with a Grignard reagent such as $CH_3MgBr$ to be methylated and then hydrolyzed.
(2) An isopropyl group-containing compound such as 1,3-diisopropylbenzene is oxidized by oxygen or the like to form a peroxide and then the peroxide is reduced.

The compounds having an acid dissociating derivative of an α-hydroxyisopropyl group are compounds having an acid dissociating group substituted for some or all of the α-hydroxyisopropyl groups of the compounds of the formulas (12), (13), (14) and (15).

Examples of the acid dissociating group include groups which form an acetal group with an oxygen atom contained in the α-hydroxyisopropyl group (to be referred to as "acetal groups" hereinafter), acyl groups and 1-branched alkoxycarbonyl groups.

The acetal groups include 1-methoxyethyl group, 1-ethoxyethyl group, 1-n-propoxyethyl group, 1-i-propoxyethyl group, 1-n-butoxyethyl group, 1-phenyloxyethyl group, 1-benzyloxyethyl group, 2-tetrahydrofuranyl group and 2-tetrahydropyranyl group.

The acyl groups include acetyl group, propionyl group and butyryl group.

The above 1-branched alkoxycarbonyl groups include isopropoxycarbonyl group, sec-butoxycarbonyl group, t-butoxycarbonyl group and 1,1-dimethylpropoxycarbonyl group.

Further, acid dissociating groups other than the above include methoxymethyl group, ethoxymethyl group, trimethylsilyl group, triethylsilyl group, t-butyl group, trimethylgermyl group, triethylgermyl group, cyclopentyl group and cyclohexyl group.

In the present invention, the acid crosslinking agents (C) may be used alone or in combination of two or more.

In the present invention, the amount of the acid crosslinking agent (C) is preferably 0.5 to 50 parts by weight, more preferably 1 to 30 parts by weight, much more preferably 2 to 20 parts by weight based on 100 parts by weight of the alkali-soluble resin (A). When the amount of the acid crosslinking agent (C) is smaller than 0.5 part by weight, its effect of suppressing the solubility in an alkali developer of the alkali-soluble resin (A) is small and the film retention of the formed resist pattern may lower or the swelling or formed serpentinely of the pattern may readily occur. When the amount is larger than 50 parts by weight, the heat resistance of the resist may lower.

The composition of the present invention may contain the following other components in addition to the above components (A), (B) and (C).

Acid Dispersion Control Agent

In the present invention, it is preferred to mix an acid dispersion control agent which has the function of controlling a phenomenon that an acid generated from an acid generating agent by exposure is dispersed in a resist film and the function of suppressing an unfavorable chemical reaction in an unexposed area. By using this acid dispersion control agent, the storage stability of a negative type radiation sensitive resin composition and the resolution of a resist obtained therefrom can be improved and changes in the line width of a resist pattern caused by fluctuations in post exposure time delay (PED) can be suppressed, thereby making it possible to obtain extremely high process stability. The acid dispersion control agent is a nitrogen atom-containing basic compound or radiation decomposable basic compound such as basic sulfonium compound or basic iodonium compound.

The nitrogen-containing organic compound is, for example, a compound (to be referred to as "nitrogen-containing compound (I)" hereinafter) represented by the following formula (16).

wherein $R^{43}$, $R^{44}$ and $R^{45}$ are each independently a hydrogen atom, alkyl group, aryl group or aralkyl group, all of which may be substituted by a functional group such as hydroxy group, diamino compound having two nitrogen atoms in the same molecule (to be referred to as "nitrogen-containing compound (II)" hereinafter), polyamino compound or polymer having three or more nitrogen atoms (to be generally referred to as "nitrogen-containing compound (III)" hereinafter), amide group-containing compound, urea compound or nitrogen-containing heterocyclic compound.

Illustrative examples of the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, triethanolamine, dimethyl-n-dodecylamine and dicyclohexylmethylamine; and aromatic amines such as aniline, N-methylaniline, N,N-dimethylaniline, 2-methylaniline, 3-methylaniline, 4-methylaniline, 4-nitroaniline, diphenylamine, triphenylamine and 1-naphthylamine.

Illustrative examples of the nitrogen-containing compound (II) include ethylenediamine, N,N,N',N'-tetramethylethylenediamine, N,N,N',N'-tetrakis(2-hydroxyropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4"-aminophenyl)-1'-methylethyl]benzene and 1,3-bis[1'-(4"-aminophenyl)-1'-methylethyl]benzene.

Illustrative examples of the nitrogen-containing compound (III) include polyethylene-imine, polyallylamine and polymers of dimethylaminoethyl acrylamide.

Illustrative examples of the above amide group-containing compound include formamide, N-methylformamide, N,N-dimethylformamide, acetamide, N-methylacetamide, N,N-dimethylacetamide, propionamide, benzamide, pyrrolidone and N-methylpyrrolidone.

Illustrative examples of the above urea compound include urea, methylurea, 1,1-dimethylurea, 1,3-dimethylurea, 1,1,3,3-tetramethylurea, 1,3-diphenylurea and tri-n-butylthiourea. Illustrative examples of the above nitrogen-containing heterocyclic compound include imidazoles such as imidazole, benzimidazole, 4-methylimidazole, 4-methyl-2-phenylimidazole and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, 2,2',2''-tripyridine, nicotine, nicotinic acid, nicotinic acid amide, quinoline, 8-oxyquinoline and acridine; pyrazine, pyrazol, pyridazine, quinoxaline, purine, pyrrolidine, piperidine, morpholine, 4-methylmorpholine, piperazine, 1,4-dimethylpiperazine and 1,4-diazabicyclo[2.2.2]octane.

The radiation decomposable basic compound is a compound represented by the following formula (17) or (18).

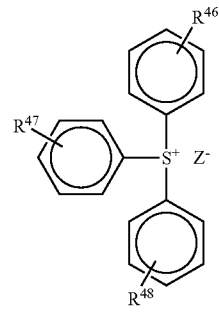

(17)

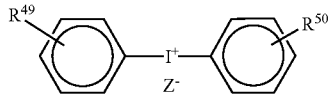

(18)

In the formula (17), $R^{46}$ to $R^{48}$ may be the same or different and each a hydrogen atom, alkyl group, alkoxyl group, hydroxyl group or halogen atom. In the formula (18), $R^{49}$ and $R^{50}$ may be the same or different and each a hydrogen atom, alkyl group, alkoxyl group or halogen atom, and $Z^-$ is a hydroxyl group, salicylate, $RCOO^-$ (R is an alkyl group having 1 to 10 carbon atoms, aryl group or alkylaryl group).

Specific examples of the radiation decomposable basic compound include triphenylsulfonium hydroxide, triphenylsulfonium salicylate, diphenyl-4-hydoxyphenylsulfonium salicylate, bis (4-t-butylphenyl)iodonium salicylate and 4-t-butylphenyl-4-hydroxyphenyliodonium salicylate.

The above acid dispersion control agents may be used alone or in combination of two or more.

The amount of the acid dispersion control agent in the present invention is preferably 0.001 to 10 parts by weight, more preferably 0.005 to 5 parts by weight, much more preferably 0.01 to 3 parts by weight based on 100 parts by weight of the alkali-soluble resin (A). When the amount of the acid dispersion control agent is smaller than 0.001 part by weight, the pattern shape and dimensional fidelity of a resist formed therefrom may deteriorate according to process conditions. Further when the post exposure time delay from exposure to baking after exposure (to be referred to as post-exposure baking hereinafter) is long, the pattern shape of an upper layer portion of the pattern may worsen. When the amount is larger than 10 parts by weight, the sensitivity of the resist and the developability of an unexposed portion may lower.

Additives

The negative type radiation sensitive resin composition of the present invention may further comprise various additives such as a dissolution control agent, dissolution promoting agent, sensitizer and surfactant.

The above dissolution control agent controls the solubility in an alkali developer of the alkali-soluble resin (A) to reduce the dissolution speed of the resin at the time of alkali development to an appropriate level when the solubility is too high. The dissolution control agent is preferably what is not chemically changed in the steps of baking, exposing and developing a resist film.

Examples of the above dissolution control agent include aromatic hydrocarbons such as naphthalene, phenanthrene, anthracene and acenaphthene; ketones such as acetophenone, benzophenone and phenylnaphthyl ketone; and sulfones such as methylphenyl sulfone, diphenyl sulfone and dinaphthyl sulfone. These dissolution control agents may be used alone or in combination of two or more.

The amount of the dissolution control agent is suitably adjusted according to the type of the alkali-soluble resin used as the component (A) but it is preferably 50 parts or less by weight, more preferably 30 parts or less by weight based on 100 parts by weight of the alkali-soluble resin (A).

The above dissolution promoting agent has the function of enhancing the solubility in an alkali developer of the alkali-soluble resin (A) to increase the dissolution speed of the resin at the time of development to an appropriate level when it is too low. The dissolution promoting agent is preferably what is not chemically changed in the steps of baking, exposing and developing a resist film.

The above dissolution promoting agent is, for example, a phenolic compound having low molecular weight and 2 to 6 benzene rings. Specific examples of the dissolution promoting agent include bisphenols and tris(hydroxyphenyl)methanes. These dissolution promoting agents may be used alone or in combination of two or more.

The amount of the dissolution promoting agent is suitably adjusted according to the type of the alkali-soluble resin used as the component (A) but it is preferably 50 parts or less by weight, more preferably 30 parts or less by weight based on 100 parts by weight of the alkali-soluble resin (A).

The above sensitizer has the function of increasing the amount of an acid generated by absorbing the energy of radiation exposed and transmitting it to the acid generating agent in order to improve the apparent sensitivity of the resist.

Examples of the sensitizer include benzophenones, biacetyls, pyrenes, phenothiazines, Eosine and Rose Bengales. These sensitizers may be used alone or in combination of two or more.

The amount of the sensitizer is preferably 50 parts or less by weight, more preferably 30 parts or less by weight based on 100 parts by weight of the alkali-soluble resin (A).

The above surfactant has the function of improving the coatability and striation of the negative type radiation sensitive resin composition of the present invention and the developability and the like of the resist.

The surfactant may be anionic, cationic, nonionic or amphoteric. It is preferably a nonionic surfactant. Examples of the nonionic surfactant include polyoxyethylene higher alkyl ethers, polyoxyethylene higher alkyl phenyl ethers and higher fatty acid diesters of polyethylene glycol. Commercially available products of the surfactant include F Top series (Tokem Products Co., Ltd.), MEGAFAC series (Dainippon Ink and Chemicals, Inc.), Florade series (Sumitomo 3M Limited), Asahi Guard and Surflon series (Asahi Glass Co., Ltd.), Pepole series (Toho Kagaku Kogyo Co., Ltd.), KP series (Shin-Etsu Chemical Co., Ltd.) and Polyflow series (Kyoeisha Kagaku Co., Ltd.).

The amount of the surfactant is preferably 2 parts or less by weight as an effective component of the surfactant based on 100 parts by weight of the alkali-soluble resin (A).

The latent image of an exposed portion can be visualized by blending a dye or pigment to ease the influence of halation at the time of exposure and adhesion to a substrate can be improved by blending an adhesive aid.

Solvent

The negative type radiation sensitive resin composition of the present invention is prepared as a resist solution by uniformly dissolving the composition in a solvent to a solids content of preferably 5 to 50 wt % and filtering the resulting solution with a filter having an opening diameter of about 0.2 μm before use.

Illustrative examples of the solvent used to prepare the above resist solution include ethylene glycol monoalkyl ether acetates such as ethylene glycol monomethyl ether acetate, ethylene glycol monoethyl ether acetate, ethylene glycol monopropyl ether acetate and ethylene glycol monobutyl ether acetate; propylene glycol monoalkyl ether acetates such as propylene glycol monomethyl ether acetate, propylene glycol monoethyl ether acetate, propylene glycol monopropyl ether acetate and propylene glycol monobutyl ether acetate; lactic acid esters such as methyl lactate, ethyl lactate, propyl lactate, butyl lactate and amyl lactate; aliphatic carboxylic acid esters such as methyl acetate, ethyl acetate, propyl acetate, butyl acetate, amyl acetate, hexyl acetate, methyl propionate and ethyl propionate; other esters such as methyl 3-methoxypropionate, ethyl 3-methoxypropionate, methyl 3-ethoxypropinate, ethyl 3-ethoxypropionate, methyl 3-methoxy-2-methylpropionate, 3-methoxybutylacetate, 3-methyl-3-methoxybutyl acetate, butyl 3-methoxy-3-methylpropionate, butyl 3-methoxy-3-methylbutyrate, methyl acetoacetate, methyl pyruvate and ethyl pyruvate; aromatic hydrocarbons such as toluene and xylene; ketones such as 2-heptanone, 3-heptanone, 4-heptanone and cyclohexanone; amides such as N,N-dimethylformamide, N-methylacetamide, N,N-dimethylacetamide and N-methylpyrrolidone; and lactones such as γ-lactone. These solvents may be used alone or in combination of two or more.

Formation of Resist Pattern

To form a resist pattern from the negative type radiation sensitive resin composition of the present invention, the above resist solution is applied to a substrate such as a silicon wafer or a wafer coated with aluminum by suitable coating means such as rotational coating, cast coating, roll coating or the like to form a resist film which is then exposed through a predetermined mask pattern.

The radiation used at this point is suitably selected from ultraviolet radiation such as i-ray, far ultraviolet radiation from a KrF excimer laser (wavelength of 248 nm) or ArF excimer laser (wavelength of 193 nm), X-radiation such as synchrotron radiation and charged corpuscular beams such as electron beams according to the type of acid generating agent. Out of these, far ultraviolet radiation is preferably used. Exposure conditions such as the amount of exposure are suitably selected according to the composition of the negative type radiation sensitive resin composition. In the present invention, in order to promote a crosslinking reaction in an exposed portion more efficiently, post-exposure baking is preferably carried out. Although heating conditions for the post-exposure baking change according to the composition of the negative type radiation sensitive resin composition, the post-exposure baking is carried out at a temperature of preferably 30 to 200° C., more preferably 50 to 150° C.

Thereafter, the exposed resist film is developed with an alkali developer to form a predetermined resist pattern.

The above alkali developer is, for example, an alkaline aqueous solution prepared by dissolving at least one alkaline compound such as a mono-, di- or tri-alkylamine, mono-, di- or tri-alkanolamine, heterocyclic amine, tetramethylammonium hydroxide or choline to a concentration of preferably 1 to 10 wt %, more preferably 1 to 5 wt %.

To the above alkali developer may be added an alcohol such as methanol or ethanol, and a surfactant in a suitable amount.

When this alkaline aqueous solution is used as the developer, the resist film is generally washed in water after development.

The following examples are provided for the purpose of further illustrating the present invention but are in no way to be taken as limiting.

EXAMPLES

Examples 1 to 12 and Comparative Example 1

Components shown in Table 1 (parts are based on weight) were mixed together to prepare a uniform solution and foreign matter was then removed from the solution by filtering it with a Teflon (registered trademark) membrane filter having an opening diameter of 0.2 μm to prepare a resist solution.

The obtained resist solution was applied to a silicon wafer having a diameter of 8 inches by rotational coating and prebaked at 90° C. to form a resist film having a thickness of 0.4 μm. This resist film was exposed to KrF excimer laser beams (wavelength of 248 nm) through a mask pattern. In Example 12, the resist film was exposed to electron beams using a simple electron beam direct illuminator (50 KeV) in place of the KrF excimer laser. After exposure, the resist film was post-exposure baked (PEB) at 110° C. for 1 minute, developed with a 2.38 wt % aqueous solution of tetramethylammonium hydroxide by the puddle method at 23° C. for 60 seconds, washed in water for 30 seconds and dried to form a negative type resist pattern.

The evaluation results of the obtained resist patterns are shown in Table 2.

Measurements and evaluations in Examples and Comparative Example were carried out by the following methods.

Mw and Dispersibility

GPC columns ($2 \times G2000H^{XL} + 1 \times G3000H^{XL} + 1 \times G4000H^{XL}$) manufactured by Toso Co., Ltd. were set in the HLC-8120 high-speed GPC of Toso Co., Ltd. to measure Mw and dispersibility by gel permeation chromatography using monodisperse polystyrene as a reference under the following analytical conditions.

flow rate: 1.0 ml/minute eluting solvent: tetrahydrofuran column temperature: 40° C.

Dissolution Speed

An alkali-soluble resin was dissolved in ethyl lactate, and the resulting solution was applied to a silicon wafer to a thickness of about 400 nm, heated at 90° C. for 90 seconds and immersed in a 2.38 wt % aqueous solution of tetramethylammonium hydroxide at 23° C. A reduction in the weight of the film per second was measured and taken as dissolution speed.

Sensitivity

The amount of exposure required for the formation of a line-and-space pattern (1L1S) having a design line width of 0.18 μm and a line/space width ratio of 1:1 was taken as the optimum amount of exposure and sensitivity was evaluated based on this optimum amount of exposure.

Resolution

The size (μm) of the smallest resist pattern (1L1S) which was resolved when it was exposed to the optimum amount of exposure was measured and taken as resolution.

Depth of Focus (DOF)

The depth of focus at each optimum amount of exposure for a line-and-space pattern (1L1S) having a design line width of 0.18 μm was changed and the width of the focusing depth at which the pattern line width fell within the range of (design line width ±10%) was taken as DOF of each pattern.

The wider DOF the higher the process margin becomes and the higher the yield becomes at the time of the production of actual devices.

Sectional form of Pattern

The size La of the lower side and the size Lb of the upper side of the square sectional form of a 1L1S pattern having a line width of 0.18 μm formed on a silicon wafer were measured using a scanning electron microscope.

A pattern shape which satisfied the following expression and did not have a round top layer portion and a recessed portion near the substrate was considered as "rectangular" and evaluated based on the following criteria.

◯: $0.90 \leq Lb/La \leq 1.10$ is satisfied and the pattern is rectangular

Δ: $0.90 \leq Lb/La \leq 1.10$ is satisfied but the pattern is not rectangular because the top portion of the pattern is round, or a recessed portion or tapered portion is seen near the substrate X: $Lb/La<0.90$ or $Lb/La>1.10$ is satisfied and a pattern cannot be formed Inspection of Resist Pattern Defect A line-and-space pattern (1L1S) having a design line width of 0.20 μm was inspected for a defect such as bridging, chip line or disconnection using the KLA-2112 defect inspection device of KLA Co., Ltd.

Synthetic Examples of Alkali-Soluble Resin (A)

Synthetic Example 1

100 g of p-t-butoxystyrene, 10 g of styrene and 9.0 g of azobisisobutyronitrile were dissolved in propylene glycol monomethyl ether to carry out a polymerization reaction at 80° C. for 9 hours. The polymerization solution was purified by re-precipitation with methanol to obtain 100 g of a copolymer of p-t-butoxystyrene/styrene having an Mw of 7,300 and an Mw/Mn of 1.80. This copolymer and 50 g of 10 wt % sulfuric acid water were dissolved in 300 g of propylene glycol monomethyl ether to carry out an acid hydrolytic reaction at 90° C. for 6 hours. The reaction solution was purified by re-precipitation with a large amount of water until it became neutral to obtain 65 g of a copolymer of p-hydroxystyrene/styrene (molar ratio of 85/15) having an Mw of 5,500 and an Mw/Mn of 1.55 (A-1).

Synthetic Example 2

The procedure of Synthetic Example 1 was repeated except that 20 g of styrene and 10 g of azobisisobutyronitrile were used to obtain 70 g of a copolymer of p-hydroxystyrene/styrene (molar ratio of 75/25) having an Mw of 5,200 and an Mw/Mn of 1.51 (A-2).

Synthetic Example 3

Polymerization and acid hydrolysis were carried out in the same manner as in Synthetic Example 1 except that 20 g of p-methoxystyrene was used in place of styrene to obtain 78 g of a copolymer of p-hydroxystyrene/p-methoxystyrene (molar ratio of 80/20) having an Mw of 5,900 and an Mw/Mn of 1.58 (A-3).

Alkali-Soluble Resins (A)

(A-1): copolymer of p-hydroxystyrene/styrene (molar ratio=85/15, Mw: 5,500, Mw/Mn: 1.55)

(A-2): copolymer of p-hydroxystyrene/styrene (molar ratio=75/25, Mw: 5,200, Mw/Mn: 1.51)

(A-3): copolymer of p-hydroxystyrene/p-methoxystyrene (molar ratio=80/20, Mw: 5,900, Mw/Mn: 1.58)

(A-4): copolymer of p-hydroxystyrene/styrene (molar ratio=84/16, Mw: 5,200, Mw/Mn: 1.12), VPS5015 of Nippon Soda Co., Ltd.

(A-5): copolymer of p-hydroxystyrene/styrene (molar ratio=78/22, Mw: 3,100, Mw/Mn: 1.13), VPS3020 of Nippon Soda Co., Ltd.

(A-6): copolymer of p-hydroxystyrene/styrene (molar ratio=84/16, Mw: 3,000, Mw/Mn: 1.13), VPS3015 of Nippon Soda Co., Ltd.

Acid Generating Agents (B)

(B-1): triphenylsulfonium trifluoromethanesulfonate (B-2): diphenyl-4-hydroxyphenylsulfonium trifluoromethanesulfonate (B-3): N-(trifluoromethylsulfonyloxy)bicycle[2.2.1]hept-5-ene-2,3-dicarboxyimide Acid Crosslinking Agents (C)

(C-1): N,N,N,N-tetra(methoxymethyl)glycoluril (C-2): 1,3,5-tris(α-hydroxyisopropyl)benzene Acid Dispersion Control Agents (D-1): dimethyl n-dodecylamine (D-2): triphenylsulfonium salicylate (D-3): 2-phenylbenzimidazole Solvents (E-1): ethyl lactate (ethyl 2-hydroxypropionate)

(E-2): ethyl 3-ethoxypropionate

TABLE 1

|  | (A) alkali-soluble resin (parts) | (B) acid generating agent (parts) | (C) acid crosslinking agent (parts) | acid dispersion control agent (parts) | Solvent (parts) |
|---|---|---|---|---|---|
| Ex. 1 | A-1/A-4 = 50/50 | B-1 = 3 | C-1 = 7 | D-1 = 0.3 | E-1/E-2 = 550/250 |
| Ex. 2 | A-2/A-4 = 50/50 | B-2 = 3 | C-1 = 7 | D-1 = 0.3 | E-1/E-2 = 550/250 |
| Ex. 3 | A-1/A-2/A-4 = 25/25/50 | B-1/B-2 = 1.5/1.5 | C-1 = 7 | D-1 = 0.3 | E-1/E-2 = 550/250 |
| Ex. 4 | A-3/A-4 = 50/50 | B-1/B-2 = 1.5/1.5 | C-1 = 7 | D-1 = 0.3 | E-1/E-2 = 550/250 |
| Ex. 5 | A-1/A-2/A-4 = 25/25/50 | B-1/B-2 = 1.5/1.5 | C-1 = 7 | D-2 = 0.3 | E-1/E-2 = 550/250 |
| Ex. 6 | A-1/A-2/A-4 = 25/25/50 | B-1/B-2 = 1.5/1.5 | C-1/C-2 = 5/5 | D-1 = 0.3 | E-1/E-2 = 550/250 |
| Ex. 7 | A-1/A-5 = 50/50 | B-1 = 3 | C-1 = 7 | D-1 = 0.3 | E-1/E-2 = 550/250 |
| Ex. 8 | A-2/A-5 = 50/50 | B-2 = 3 | C-1 = 7 | D-1 = 0.3 | E-1/E-2 = 550/250 |
| Ex. 9 | A-1/A-2/A-4= 40/10/50 | B-3 = 8 | C-1 = 7 | D-3 = 3 | E-1/E-2 = 550/250 |
| Ex. 10 | A-1/A-2/A-4/A-5 = 20/30/10/40 | B-1/B-2 = 1.5/1.5 | C-1 = 7 | D-1 = 0.3 | E-1/E-2 = 550/250 |
| Ex. 11 | A-1/A-2/A-4/A-5 = 10/40/25/25 | B-1/B-2 = 1.5/1.5 | C-1 = 7 | D-2 = 0.3 | E-1/E-2 = 550/250 |
| Ex. 12 | A-2/A-5 = 50/50 | B-2 = 8 | C-1 = 7 | D-2 = 0.3 | E-1/E-2 = 550/250 |
| C.Ex. 1 | A-5 = 100 | B-1 = 3 | C-1 = 7 | D-1 = 0.3 | E-1/E-2 = 550/250 |

Ex.: Example C.Ex.: Comparative Example

TABLE 2

|  | (A) alkali-soluble resin | | | sensitivity ($J/m^2$) | resolution (μm) | focus margin (μm) | pattern sectional form | number of defects (per wafer) |
|---|---|---|---|---|---|---|---|---|
|  | Mw | Mw/Mn | dissolution speed (nm/sec) | | | | | |
| Ex. 1 | 5300 | 1.34 | 90 | 300 | 0.17 | 1.0 | ○ | 70 |
| Ex. 2 | 5200 | 1.33 | 45 | 360 | 0.17 | 1.0 | ○ | 20 |
| Ex. 3 | 5300 | 1.33 | 70 | 310 | 0.17 | 1.1 | ○ | 5 |
| Ex. 4 | 5500 | 1.37 | 60 | 310 | 0.17 | 1.0 | ○ | 10 |
| Ex. 5 | 5300 | 1.33 | 70 | 330 | 0.16 | 1.2 | ○ | 5 |
| Ex. 6 | 5300 | 1.33 | 70 | 370 | 0.17 | 1.0 | ○ | 10 |
| Ex. 7 | 4300 | 1.37 | 70 | 320 | 0.18 | 0.9 | ○ | 10 |
| Ex. 8 | 4200 | 1.38 | 40 | 330 | 0.18 | 0.9 | ○ | 5 |
| Ex. 9 | 5300 | 1.34 | 75 | 400 | 0.18 | 0.9 | ○ | 10 |
| Ex. 10 | 4400 | 1.40 | 70 | 330 | 0.17 | 1.1 | ○ | 2 |
| Ex. 11 | 4700 | 1.39 | 70 | 340 | 0.16 | 1.1 | ○ | 2 |
| Ex. 12 | 4200 | 1.38 | 40 | 6 μC | 0.08 | — | ○ | 10 |
| C. Ex. 1 | 3100 | 1.13 | 60 | 300 | 0.17 | 1.1 | ○ | >100 |

Ex.: Example C. Ex.: Comparative Example

The negative type radiation sensitive resin composition of the present invention can be used with an alkali developer having a normal concentration as a chemically amplified negative type resist and can form a high-resolution rectangular line-and-space resist pattern, has excellent sensitivity, developability and dimensional fidelity as well as resolution and pattern shape, and can be used with radiation having a shorter wavelength such as far ultraviolet radiation from an excimer laser, X-radiation such as synchrotron radiation and charged corpuscular beams such as electron beams. Therefore, it can be extremely advantageously used for the production of semiconductor devices whose design rule will be further reduced in the future.

What is claimed is:

1. A negative type radiation sensitive resin composition comprising:
   (A) an alkali-soluble resin containing the polymerized unit of a polymerizable unsaturated compound having a phenolic hydroxyl group and having a weight average molecular weight of 4,100 to 20,000 and a weight average molecular weight/number average molecular weight ratio of more than 1.25 to not more than 2.00;
   (B) a radiation sensitive acid generating agent; and
   (C) an acid crosslinking agent;
   wherein the alkali-soluble resin (A) is at least one copolymer selected from the group consisting of a copolymer of p-vinylphenol and styrene and a copolymer of p-vinylphenol and α-methylstyrene; and
   wherein the acid crosslinking agent (C) is an N-(alkoxymethyl)glycoluril compound represented by the following formula (8):

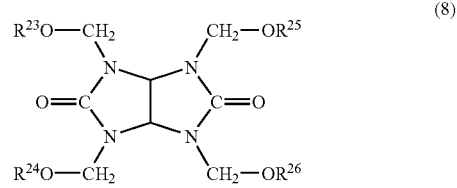

(8)

wherein $R^{23}$ to $R^{26}$ are each independently an alkyl group having 1 to 4 carbon atoms or a combination of an N-(alkoxymethyl)glycoluril compound represented by the formula (8) and a compound represented by the following formula (12):

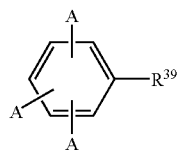
(12)

wherein As are each independently an α-hydroxyisopropyl group or hydrogen atom, with the proviso that at least one A is an α-hydroxyisopropyl group, and $R^{39}$ is a hydrogen atom, hydroxyl group, linear or branched alkylcarbonyl group having 2 to 6 carbon atoms, or linear or branched alkoxycarbonyl group having 2 to 6 carbon atoms.

2. The resin composition of claim 1, wherein the weight average molecular weight of the alkali-soluble resin (A) is 4,500 to 20,000.

3. The resin composition of claim 1, wherein the dissolution speed in a 2.38 wt % aqueous solution of tetramethylammonium hydroxide of the alkali-soluble resin (A) at 23° C. is 10 to 130 nm/s when it is a coating film.

4. The resin composition of claim 1, wherein the alkali-soluble resin (A) is a mixture of a polymer obtained by the anion polymerization of a polymerizable unsaturated compound having a phenolic hydroxyl group and a polymer obtained by radical polymerization.

5. The resin composition of claim 4, wherein the weight average molecular weight/number average molecular weight ratio of the polymer obtained by anion polymerization is 1.0 to 1.2 and the weight average molecular weight/number average molecular weight ratio of the polymer obtained by radical polymerization is 1.4 to 1.7.

6. The resin composition of claim 1, wherein the radiation sensitive acid generating agent (B) is at least one selected from the group consisting of an onium salt compound, sulfonimide compound, diazomethane compound, di sulfonylmethane compound, halogen-containing compound, sulfone compound, sulfonic acid ester compound and oxime sulfonate compound.

7. The resin composition of claim 1, wherein the radiation sensitive acid generating agent (B) is an onium salt or sulfonic acid imide.

8. The resin composition of claim 1, wherein the radiation sensitive acid generating agent (B) is an onium salt having a phenolic hydroxyl group.

9. The resin composition of claim 1, wherein the radiation sensitive acid generating agent (B) is a combination of an onium salt having a phenolic hydroxyl group and another onium salt.

10. The resin composition of claim 1, which further comprises an acid dispersion control agent.

11. The resin composition of claim 10, wherein the acid dispersion control agent is selected from the group consisting of a nitrogen atom-containing basic compound, basic sulfonium compound and basic iodonium compound.

12. The resin composition of claim 1, wherein the content in the resin of the polymerized unit of a polymerizable unsaturated compound having a phenolic hydroxy group is 50 to 90 mol %.

13. The resin composition of claim 1, which can form a resist pattern having a resolution of 0.18 μm or less when a resist film made from the composition is exposed to KrF excimer laser radiation.

14. The resin composition of claim 1, which is sensitive to radiation from a KrF excimer laser.

15. The negative type radiation sensitive resin composition of claim 1, wherein the acid crosslinking agent (C) is a combination of an N-(alkoxymethyl)glycoluril compound represented by the formula (8) and a compound represented by the formula (12).

* * * * *